United States Patent [19]

Legge et al.

[11] 4,382,099
[45] May 3, 1983

[54] DOPANT PREDEPOSITION FROM HIGH PRESSURE PLASMA SOURCE

[75] Inventors: Ronald N. Legge, Scottsdale; Kalluri R. Sarma, Tempe, both of Ariz.

[73] Assignee: Motorola, Inc., Schaumburg, Ill.

[21] Appl. No.: 314,609

[22] Filed: Oct. 26, 1981

[51] Int. Cl.$^3$ ............................................. B05D 1/08
[52] U.S. Cl. ........................................ 427/34; 427/85
[58] Field of Search ................................... 427/34, 85

[56] References Cited

U.S. PATENT DOCUMENTS

| | | | |
|---|---|---|---|
| 3,246,114 | 4/1966 | Matuay | 427/34 |
| 3,916,034 | 10/1975 | Tsuchimoto | 427/85 |
| 4,003,770 | 1/1977 | Janowiecki et al. | 427/34 |
| 4,179,312 | 12/1979 | Keller et al. | 427/85 |
| 4,226,897 | 10/1980 | Coleman | 427/39 |
| 4,279,671 | 7/1981 | Komatsu | 427/85 |

OTHER PUBLICATIONS

Rand, "J. Vac. Sci. Technol.", vol. 16, No. 2, 1979, pp. 420–427.
Knights et al., "Solid State Communications", vol. 21, pp. 983–986, 1977.

Primary Examiner—John H. Newsome
Attorney, Agent, or Firm—John A. Fisher

[57] ABSTRACT

A method is provided for predepositing dopant material on semiconductor substrates. The semiconductor substrates are positioned within a high pressure plasma reactor apparatus. A high pressure rf plasma is generated in the apparatus at a pressure of about one atmosphere or greater. Dopant materials such as $B_2H_6$, $PH_3$, or $AsH_3$ are introduced to the plasma and form ionized species of the dopant. The plasma and the ionized species are directed to the surface of the semiconductor substrates whereon a uniform layer of the dopant is deposited.

10 Claims, 7 Drawing Figures

DOPANT PREDEPOSITION FROM HIGH PRESSURE PLASMA SOURCE

BACKGROUND OF THE INVENTION

This invention relates to a method for predepositing dopant material on semiconductor substrates, and especially to a method for predepositing impurity dopant on a semiconductor substrate from a high pressure plasma source.

In the fabrication of most semiconductor devices localized doped regions are formed in a semiconductor substrate to form p-n junctions or to form regions of high dopant concentration within a background of lower dopant concentration. The doped region is usually formed by predepositing a layer of doped oxide or doped glass on the surface of the substrate and then subsequently heating the substrate to an elevated temperature. At the elevated temperature the dopant in the doped layer is redistributed by thermal diffusion of the dopant into the semiconductor substrate as well as within the layer. It has been conventional to predeposit the doped layer of glass or oxide on the substrate by reacting a dopant material with an oxide former, typically in a diffusion furnace at an elevated temperature. Representative reactions include the reaction of diborane ($B_2H_6$) with oxygen to form $B_2O_3$, or the reaction of phosphine ($PH_3$) with oxygen to form $P_2O_5$.

While predeposition of a doping source from a thermal reaction as described above has long served as an acceptable predeposition method, with the advent of larger and larger substrates and with the need for high throughputs in diffusion processes, the inadequacies of these prior art methods are becoming apparent. In order to achieve a high throughput in a predeposition process, a large number of these semiconductor substrates must be accommodated in a high temperature reaction apparatus in each process run. The high number of wafers in the apparatus can be achieved by closely spacing the substrates, but closely spaced, large sized substrates lead to nonuniformities in the deposition of the dopant glass. The nonuniformities result from the dynamics of the gas flow as the reactant gases including the dopant material pass down the predeposition reactor and diffuse into the narrow spaces separating the substrates. The gas flow dynamics are such that a relatively thicker deposit of dopant material is formed near the periphery of the substrates and a relatively thinner, less highly doped deposit is provided in the center of the substrates. Another factor which contributes to the nonuniformity of the resultant diffusion is that the predeposition is done at an elevated temperature. At the elevated temperature significant diffusion is occurring during the predeposition. Because of this, the junction depth at the substrate periphery is deeper than near the substrate center.

In addition to problems with nonuniformity, predeposition of a doped oxide layer from which the dopant material is diffused results in the formation of an insulating layer on the surface of the substrate which subsequently must be removed at least locally to allow electrical contact to the doped region. Removing this insulating layer requires an additional processing step.

The disadvantage of the nonuniform deposit can be overcome by placing fewer substrates in the reactor, by increasing the spacing between the substrates, or by placing the substrates flat within the reactor rather than "coin stacking" them in a stand up, face-to-face relationship. These solutions, however, result in a lowered throughput which, of course, increases the cost of the predeposition process.

The problem with nonuniform predeposition of dopant material as well as the problem of depositing an insulating material on the substrate surface, which must be subsequently removed, can both be overcome by an ion implantation predeposition process. In this process, the dopant material is implanted directly into the surface of the substrate. No insulating layer need be formed on the substrate surface and the ion implantation can be relatively uniform and controllable across the surface of a substrate and from substrate to substrate. Ion implantation equipment, however, is not amenable to high volume, high throughput processing. Additionally, ion implantation equipment is expensive. The ion implant process must be carried out at low pressures which requires vacuum equipment with all of the problems associated therewith, as well as long cycle times associated with vacuum pump down and the like.

Accordingly, there is presently a need for an improved predeposition method which will overcome the disadvantages of these prior art methods to provide uniform diffusion predepositions at a high throughput for the processing of semiconductor devices and especially large area semiconductor devices such as photovoltaic devices.

It is therefore an object of this invention to provide a high pressure plasma process for predepositing dopant upon a semiconductor substrate.

It is a further object of this invention to provide an improved process for preferentially depositing dopant on a selected surface of a semiconductor substrate.

It is another object of this invention to provide an improved method for predepositing dopant upon a semiconductor substrate without also forming an insulator film on the substrate surface.

It is yet another object of this invention to provide an improved method for predepositing different dopant type impurities upon the different major surfaces of a semiconductor substrate.

SUMMARY OF THE INVENTION

The foregoing and other objects are achieved in the present invention through the use of a high pressure plasma predeposition process. Semiconductor substrates upon which an impurity dopant is to be predeposited are positioned within a high pressure plasma reactor apparatus. A high pressure rf plasma is generated within the apparatus at a pressure of about one atmosphere or greater. Dopant material is introduced to the plasma and a dopant plasma is formed, forming ionized species of the dopant material. The plasma is directed to cause the ionized species to impinge upon the surface of the semiconductor substrate and to form a layer of dopant material thereon.

DETAILED DESCRIPTION OF PREFERRED EMBODIMENTS

Figure 1:
FIGS. 1–4 illustrate process steps in doping a semiconductor substrate.

Central to the invention is the use of a high pressure plasma. A plasma can be defined generally as an approximately neutral cloud of charged particles. The types and characteristics of plasmas can vary widely; two types commonly of interest are the low pressure and high pressure plasmas. The boundary line which distinguishes between the two types of plasma is a pressure greater than about 13.3 KPa (100 torr), but for practical purposes, the high pressure plasma (HPP) utilized in practicing the invention is typically produced at a pressure of about one atmosphere or greater.

The frequency of collisions between electrons, ions, and neutral species in a plasma is directly proportional to the pressure. In a low pressure plasma the resulting frequency of collisions is low and the electron and gas temperatures are significantly different. Thus, while the electron temperature in a low pressure plasma may be several thousand degrees Kelvin, the gas can be at or near room temperature. In contrast, in a high pressure plasma, the high frequency of collisions results in thermal equilibrium between electrons, ions, and neutral species. The HPP gas temperature thus can also reach several thousand degrees Kelvin.

The difference in gas temperature in a high pressure plasma in contrast to a low pressure plasma results in a significantly different chemical reactivity. In a low pressure plasma chemical reactions take place because of the presence of plasma generated free radicals; in contrast, in a high pressure plasma, chemical reactions are enhanced by both the presence of free radicals and by the extremely high gas temperatures. Because of the high gas temperatures experienced in HPP, all chemical equilibria are pushed in the direction of endothermic reactions, that is, either to the formation of endothermic compounds or to the more or less complete decomposition of exothermic compounds introduced into the plasma. Impurity dopant compounds $B_2H_6$, $PH_3$, and $AsH_3$, for example, are all exothermic compounds. The exothermic nature of these compounds is illustrated by the heat of formation for the reactions:

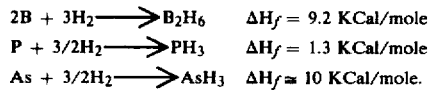

$2B + 3H_2 \longrightarrow B_2H_6 \quad \Delta H_f = 9.2$ KCal/mole $P + 3/2H_2 \longrightarrow PH_3 \quad \Delta H_f = 1.3$ KCal/mole $As + 3/2H_2 \longrightarrow AsH_3 \quad \Delta H_f = 10$ KCal/mole.

A plasma may be formed, for example, by a high frequency, high voltage electric field or by a low frequency arc discharge. The process in accordance with the invention utilizes a high pressure, high frequency (rf) plasma.

The low frequency or d.c. arc plasma is characterized by a high current density (i.e. thousands of amps per square centimeter) and by low potential difference (i.e. tens of volts) between two closely spaced electrodes. High electrode temperatures are generated requiring significant water cooling of the electrodes and resulting in inefficient energy utilization. Even with the water cooling, however, some amount of electrode erosion inevitably takes place. This erosion of the electrodes is a source of contamination in arc plasma systems because the eroded material mixes with the plasma.

In comparison, an rf driven high pressure plasma is a high voltage (i.e. several thousand volts) and low current (i.e. several tens of milliamps) plasma that can be operated, for example, at or above atmospheric pressure. Although other high pressure plasma configurations are possible, in the configuration herein disclosed there is only one (hollow) electrode. The other electrode is a distant ground. Cooling of the power electrode in this configuration is accomplished naturally in accordance with the Joule-Thomson effect by the expansion of the cool process gases flowing at the tip of the hollow electrode. No energy is thus wasted as dissipated heat carried away by a cooling liquid. The rf HPP system is thus very energy efficient. Additionally, and very significantly, since there is no electrode erosion in the rf system, there is no possibility of electrode contamination of the plasma.

FIGS. 1-4 illustrate the doping of the surface portion of a semiconductor substrate in accordance with the invention. FIG. 1 illustrates, in cross-section, a semiconductor substrate 10 having an exposed and cleaned surface portion 12. The semiconductor substrate can be silicon, germanium, gallium arsenide, other III-V compound, or the like. The substrate can be in the form of a wafer, slab, ribbon, or the like. In fabricating many devices only selected portions of the surface 12 will be exposed through openings in a masking oxide or other insulating layer. For other devices, such as photovoltaic cells, the entire substrate surface may be exposed.

Figure 2:
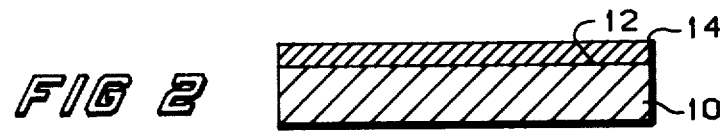

FIG. 2 illustrates the deposition of a layer of impurity dopant 14 on surface 12. In accordance with the invention, the impurity doping layer is deposited in a high pressure plasma deposition process. If semiconductor substrate 10 is silicon, the predeposited layer 14 can be, for example, arsenic or phosphorus as n-type dopants, or boron as a p-type dopant. It is believed, for example, that predepositing phosphorus in accordance with the invention deposits a layer of elemental phosphorus on the substrate surface.

Figure 3:
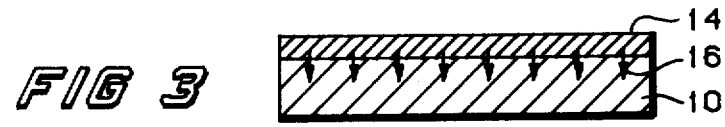

As illustrated in FIG. 3, after predepositing the impurity dopant layer 14 on semiconductor substrate 10, the predeposited layer can be utilized as a dopant source in a thermal redistribution process. Upon subjecting the semiconductor substrate with the deposited layer thereon to an elevated temperature, impurity dopant diffuses out of the predeposited layer into the semiconductor substrate. Redistribution of the dopant from the predeposited layer into the substrate is illustrated by the arrows 16.

Figure 4:
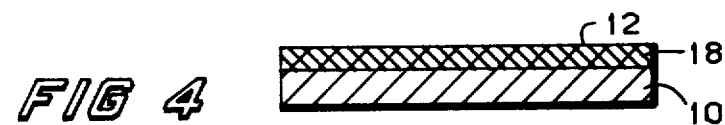

FIG. 4 illustrates the semiconductor substrate after completion of the thermal redistribution. The thermal redistribution results in a diffused region 18 extending into the semiconductor substrate 10 and away from the exposed surface 12. Following the redistribution no deposit is left on surface 12 of the semiconductor substrate. Electrical contact can be made directly to the surface of diffused region 18.

Figure 5:
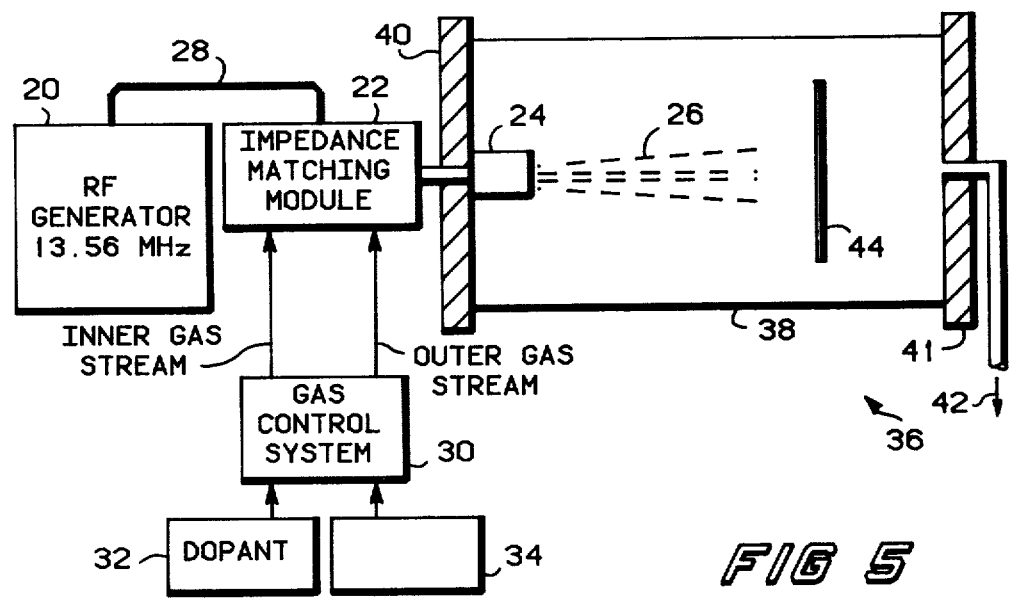
FIG. 5 illustrates apparatus for practice of the invention.

FIG. 5 illustrates an apparatus suitable for practice of the invention. The apparatus includes an rf generator 20 operating at 13.56 MHz, an impedance matching module 22, and a dual-flow nozzle 24 for sustaining a high pressure rf plasma beam 26. While the exact frequency of the rf generator is not critical to the invention, this particular frequency is chosen in accordance with FCC regulations. A coaxial cable 28 connects the rf generator to impedance matching module 22.

The impedance matching module and the dual flow high pressure plasma nozzle are described in more detail in co-pending, commonly assigned application Ser. No. 148,049 filed May 9, 1980, the contents of which are incorporated herein by reference. The impedance matching module is a π network including a coaxial coil having two concentric tubes in combination with two variable capacitors. The coaxial coil, besides functioning in the impedance matching module, provides for conveying separate inner and outer gas streams through the rf circuit to the plasma nozzle. When the π network is tuned for resonance the voltage at the output of the network reaches a maximum, a voltage sufficient to create and maintain a high pressure plasma at the tip of the nozzle. The dual flow, high pressure plasma nozzle includes a hollow electrode through which the inner gas stream from the impedance matching module flows. The outer gas stream from the impedance matching module flows through openings arranged concentrically about the hollow electrode. The nozzle is structured to permit the isolation of the two gas streams until they exit at the tip of the nozzle.

FIG. 5 also illustrates a gas control system 30 for controlling the input of a selected impurity dopant 32 and a plasma gas or diluent 34. The two gases are conveyed to gas control system 30 which comprises appropriate valves and mass flow controllers for the safe and precise control of the reactants. The gases are conveyed from the controller to the impedance matching module where they enter the inner and outer gas streams.

The high pressure plasma predeposition takes place within a reactor 36. The reactor can be simply a quartz tube 38 sealed at the ends by end seals 40,41. An exhaust 42 provides for removal of reaction products from the reactor. Substrate 44 is placed within the reactor so that the high pressure plasma 26 impinges upon the surface of the substrate. The distance between the high pressure plasma nozzle and the substrate is controllable to regulate the temperature rise of the substrate.

The exact pressure within the reactor depends on the flow rate of reactants, the rf power of the plasma beam (because of gas expansion by heating), and the resistance of the gas flow line 42 exiting the reactor. Control of the pressure at any one specific value is not required. Generally the reactor is not evacuated, however, with the result that the pressure within the reactor is maintained at or above about one atmosphere.

Figure 6:
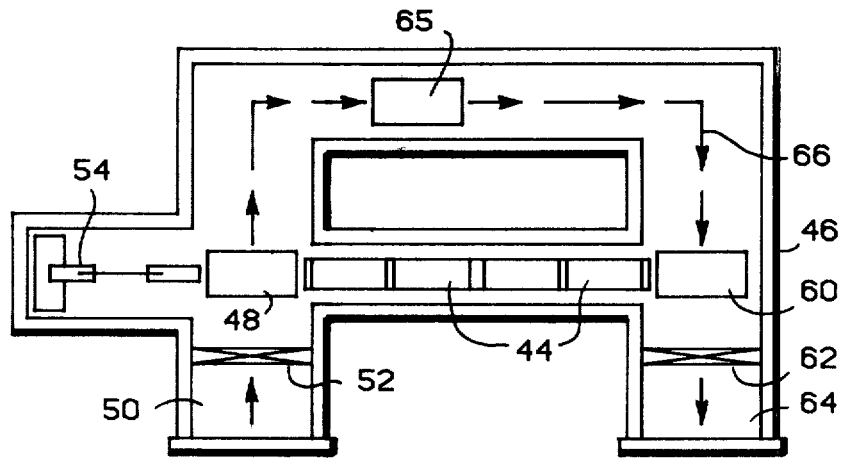
FIGS. 6–7 illustrate further apparatus for practice of the invention.
Figure 7:
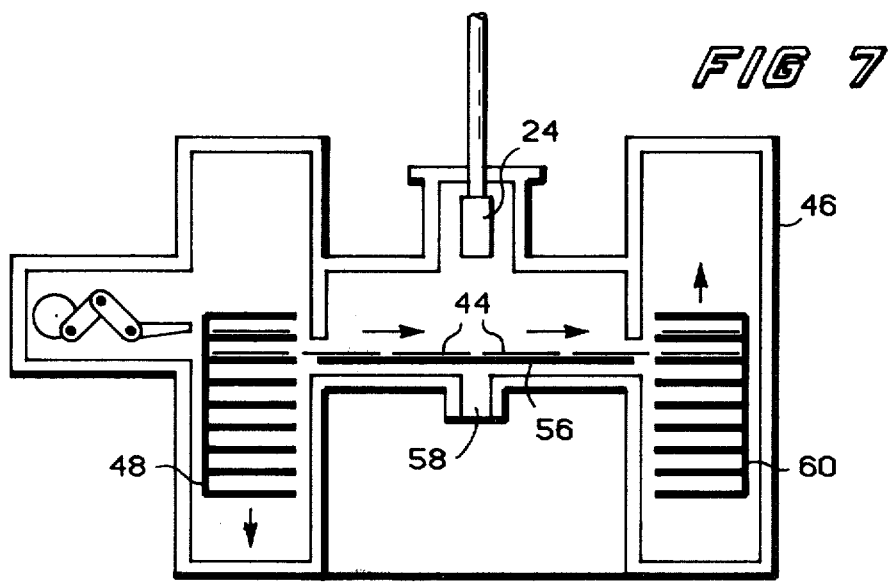

FIGS. 6 and 7 illustrate further apparatus 46 in cross-sectional top and side views, respectively. The apparatus depicted is suitable for continuous predeposition of a dopant impurity layer upon a plurality of semiconductor substrates. A plurality of substrates 44 are introduced to the plasma apparatus from an input cassette 48. The input cassette is loaded into the apparatus through an input chamber 50 connected to the interior of the apparatus through a gas interlock 52. A pusher mechanism 54 pushes substrates out of the cassette and onto a moving conveyor 56. The plurality of substrates on the conveyor move past an HPP nozzle 24 at a speed appropriate for the deposition of the requisite amount of dopant impurity upon the substrate surface. Effluent from the deposition reaction is exhausted through exhaust 58.

After deposition of the impurity dopant upon the surface of the substrates, the substrates continue to move through the apparatus on the conveyor to an output cassette 60. After cassette 60 is loaded with substrates, it is removed from the apparatus through a second gas interlock 62 and an output chamber 64. The emptied input cassette 65 can be moved through the apparatus as depicted by the arrows 66 to be later used as an output cassette.

In the HPP process the mean free path for the deposit species is relatively short. Because of this property, the plasma dopant stream can be directed at a single selected surface of the semiconductor substrate; no dopant is deposited on the opposite surface. Thus no unwanted p-n junction is formed on the opposite surface which must be removed to make a functioning device. In contrast, in a low pressure plasma system the mean free path at the reduced pressure is so long that deposition occurs on both sides of the substrate.

Because deposition in the HPP process can be limited to a selected side, the deposition equipment of FIGS. 5–7 can be modified to provide two independent HPP nozzles, each positioned to direct a plasma stream at a different substrate surface. Different dopants can be introduced to the two plasma streams to, for example, dope the substrate surfaces n- and p-type, respectively. Alternatively, a predeposition layer can be formed on a first substrate in a first predeposition operation, followed by the formation of a second predeposition layer on a second surface in a subsequent operation. The two predeposition operations can be carried out in the same or separate equipment.

The HPP predeposition process in accordance with the invention is a low temperature process. Substrate temperature during the process is adjusted by varying the spacing between nozzle and substrate. Substrate temperature is readily controlled to a temperature of less than about 300° C. If desired, other predeposition temperatures can be provided, for example, by adding substrate heating and/or cooling means to the apparatus.

The following nonlimiting examples further illustrate practice of the process in accordance with the invention. For purposes of ease of illustration only, these examples are limited to the fabrication of a specific semiconductor device, namely a silicon photovoltaic cell. The invention is not, of course, limited to these illustrative embodiments.

EXAMPLE 1

A 0.1 Ohm centimeter n-type Czochralski grown silicon substrate is placed in an HPP reactor apparatus. The apparatus is flushed with nitrogen. Hydrogen is flowed through both the inner and outer gas streams. The rf generator is energized at a power of approximately 500 watts. The impedance-matching module is tuned to resonance causing a hydrogen plasma to be created. A dilute mixture of about 10 ppm of $B_2H_6$ in hydrogen is introduced into the inner gas stream to create a plasma of both the $B_2H_6$ and the hydrogen. The plasma stream is directed onto the surface of the silicon substrate for 10 minutes to deposit a layer of boron onto the surface of the wafer. During the predeposition time, the substrate surface temperature rises to a temperature of less than about 200° C. After the 10 minute predeposition time, $B_2H_6$ flow is terminated, the plasma generator is turned off, and the apparatus is again flushed with nitrogen.

Upon removing the substrate from the apparatus, a layer of less than 200 Angstroms thickness is observed on the substrate surface. The layer is believed to comprise elemental boron.

Following predeposition, the substrate is subjected to a 950° C. redistribution cycle for 20 minutes to form a p-n junction at the substrate surface. After the redistribution, no film is observed on the substrate surface, and the p-n junction can be probed directly. Upon exposure to AM1 illumination, an open-circuit voltage of 600 millivolts is measured.

EXAMPLE 2

In similar manner, p-n junctions are formed in a p-type substrate using a $PH_3$ dopant. A one Ohm centimeter p-type silicon substrate is placed in the HPP reactor. A layer of elemental phosphorus is deposited on the silicon substrate using dilute $PH_3$ in hydrogen as the dopant source in the high pressure plasma. The predeposition is continued for five minutes during which time the plasma nozzle-to-substrate spacing is adjusted to maintain the substrate surface temperature at less than about 70° C. After the deposition the phosphorus is redistributed in the silicon substrate by heating to 900° C. for 20 minutes. The open circuit voltage of the resulting p-n junction is measured to be about 570 millivolts under AM1 illumination. The sheet resistance of the junction is measured to be about 48 Ohms per square at a junction depth of about 0.5 micrometers.

Although one advantage of the present invention is that predepositions of dopant material can be achieved without forming an undesired insulating film on the semiconductor substrate, there may be applications where it is desired to form a particular film on the surface. In forming some photovoltaic devices, for example, an antireflective coating such as a layer of silicon nitride about 800 Å in thickness can be formed over the predeposited layer before the thermal redistribution. In addition to functioning as an antireflective coating, the silicon nitride layer "caps" the predeposition layer and prevents out diffusion during the thermal redistribution.

Thus it is apparent that there has been provided a high pressure plasma predeposition process which fully meets the objects and advantages set forth above. While the invention has been described with respect to specific embodiments thereof, it is not intended that the invention be so limited. After consideration of the above disclosure those skilled in the art will appreciate that a variety of n- or p-type impurity dopants can be predeposited on a variety of n- or p-type substrates of silicon or other semiconductor material. Those skilled in the art will also appreciate that variations and modifications in the predeposition and redistribution equipment can be made to accommodate specific substrates and specific predeposition requirements. The total deposition time required to achieve a desired predeposition can be varied, for example, by adjusting the dilution of the dopant source and the rf power level. The very dilute sources utilized in the above illustrative examples allow long predeposition times and corresponding easy control of the total amount of dopant deposit. Accordingly, it is intended that all such variations and modifications be encompassed by the invention.

We claim:

1. A method for predepositing dopant material on a semiconductor substrate without codepositing an insulator or semiconductor which comprises the steps of: providing a high pressure plasma reactor apparatus; positioning a semiconductor substrate in said apparatus; generating within said apparatus a high pressure rf plasma at a pressure of about one atmosphere or greater; introducing dopant material to said plasma to form ionized species of said dopant; and directing said plasma and said ionized species to impinge upon said semiconductor substrate and to deposit thereon a layer of dopant material only.

2. The method of claim 1 wherein in said step of positioning, said substrate is located to control the temperature of said substrate.

3. A method for forming doped regions in a semiconductor substrate which comprises the steps of: providing a semiconductor substrate having an exposed surface portion; positioning said substrate in a high pressure plasma reactor apparatus; providing a plasma gas; creating a high pressure rf plasma in said plasma gas at a pressure of about one atmosphere or greater; introducing a second gas comprising a dopant impurity to said plasma gas; reacting said second gas in said plasma to form ionized species of said dopant impurity; directing said plasma toward said exposed surface portion of said substrate to deposit only said dopant impurity thereon; and heating said substrate to redistribute said dopant impurity in said semiconductor substrate.

4. The method of claim 3 wherein said dopant impurity is selected from the group consisting of $B_2H_6$, $AsH_3$ and $PH_3$.

5. The method of claim 3 further comprising the step of depositing a layer comprising silicon nitride overlying said dopant impurity.

6. A method for predepositing dopant material on opposed surfaces of a semiconductor substrate which comprises the steps of: providing a semiconductor substrate having first and second opposed surfaces; generating a first high pressure rf plasma; introducing a first dopant material to said first plasma to form a plasma of said first dopant; directing said plasma of said first dopant to said first opposed surface to deposit a layer of only said first dopant material thereon; generating a second high pressure rf plasma; introducing a second dopant material to said second plasma to form a plasma of said second dopant; and directing said plasma of said second dopant to said second opposed surface to deposit a layer of only said second dopant material thereon.

7. The method of claim 6 wherein said first dopant and said second dopant are of opposite impurity determining type.

8. The method of claim 6 wherein said first and second high frequency plasmas are generated at a pressure of about one atmosphere or greater.

9. The method of claim 6 wherein said substrate is maintained at a temperature of less than about 300° C. during said steps of directing.

10. A method for making a photovoltaic device which comprises the steps of: providing a high pressure plasma reactor apparatus; positioning a substrate of a first conductivity type in said apparatus; generating in said apparatus a high pressure rf plasma; introducing to said plasma a dopant of a second conductivity determining type; directing said plasma and said dopant to a surface of said substrate and forming a layer of only said dopant thereon; and heating said substrate with said layer thereon to an elevated temperature to form a p-n junction in said substrate.

* * * * *